(12) United States Patent
Koefer et al.

(10) Patent No.: US 8,617,799 B2
(45) Date of Patent: Dec. 31, 2013

(54) POST ARRAYS AND METHODS OF MAKING THE SAME

(75) Inventors: Robert Koefer, Whitehall, PA (US); Sheng Liu, Harrison, NJ (US); Thomas Tombler, Somerset, NJ (US)

(73) Assignee: API Technologies Corp., South Plainfield, NJ (US)

( * ) Notice: Subject to any disclaimer, the term of this patent is extended or adjusted under 35 U.S.C. 154(b) by 658 days.

(21) Appl. No.: 12/563,683

(22) Filed: Sep. 21, 2009

(65) Prior Publication Data

US 2010/0075262 A1    Mar. 25, 2010

Related U.S. Application Data

(60) Provisional application No. 61/099,121, filed on Sep. 22, 2008.

(51) Int. Cl.
*G02B 3/00*    (2006.01)
*G03F 7/20*    (2006.01)

(52) U.S. Cl.
USPC .......................................... 430/321; 430/330

(58) Field of Classification Search
None
See application file for complete search history.

(56) References Cited

U.S. PATENT DOCUMENTS

| | | | |
|---|---|---|---|
| 5,286,583 A * | 2/1994 | Hirokane et al. | 430/5 |
| 6,242,162 B1 * | 6/2001 | Ro et al. | 430/321 |
| 6,872,512 B2 * | 3/2005 | Yamashita | 430/322 |
| 2003/0142247 A1 * | 7/2003 | Nishiyama et al. | 349/67 |
| 2005/0224694 A1 * | 10/2005 | Yaung | 250/208.1 |
| 2005/0230348 A1 * | 10/2005 | Kido | 216/58 |
| 2007/0155095 A1 * | 7/2007 | Kim | 438/257 |
| 2007/0264424 A1 | 11/2007 | Wang | |
| 2007/0293044 A1 * | 12/2007 | Perozziello et al. | 438/689 |
| 2008/0096298 A1 * | 4/2008 | Chabinyc et al. | 438/29 |
| 2008/0258305 A1 * | 10/2008 | Lee et al. | 257/758 |

FOREIGN PATENT DOCUMENTS

| | | | |
|---|---|---|---|
| JP | 56-049526 | * | 5/1981 |
| JP | 2004-226962 | * | 8/2004 |

OTHER PUBLICATIONS

Translation JP-2004-226962(Aug. 2004).*

* cited by examiner

*Primary Examiner* — John A. McPherson
(74) *Attorney, Agent, or Firm* — RatnerPrestia

(57) ABSTRACT

In general, in one aspect, the invention features a method that includes forming layer of a mask material on a surface of a first layer, patterning the layer of the mask material to obtain a mask feature, the mask feature having a surface comprising a depression, inducing mass transport of the mask material of the mask feature to obtain a modified mask feature, and transferring a profile of the modified mask feature into the first layer to form a first structure. In general, in another aspect, the invention features a method that includes forming layer of a mask material on a surface of a first layer, patterning the layer of the mask material to obtain a mask feature, inducing mass transport of the mask material of the mask feature to obtain a modified mask feature, and transferring a profile of the modified mask feature into the first layer to form a first structure. The first layer is composed of an amorphous material and the first structure is a post having a base side-wall angle of in a range from about 60 degrees to about 80 degrees.

20 Claims, 20 Drawing Sheets

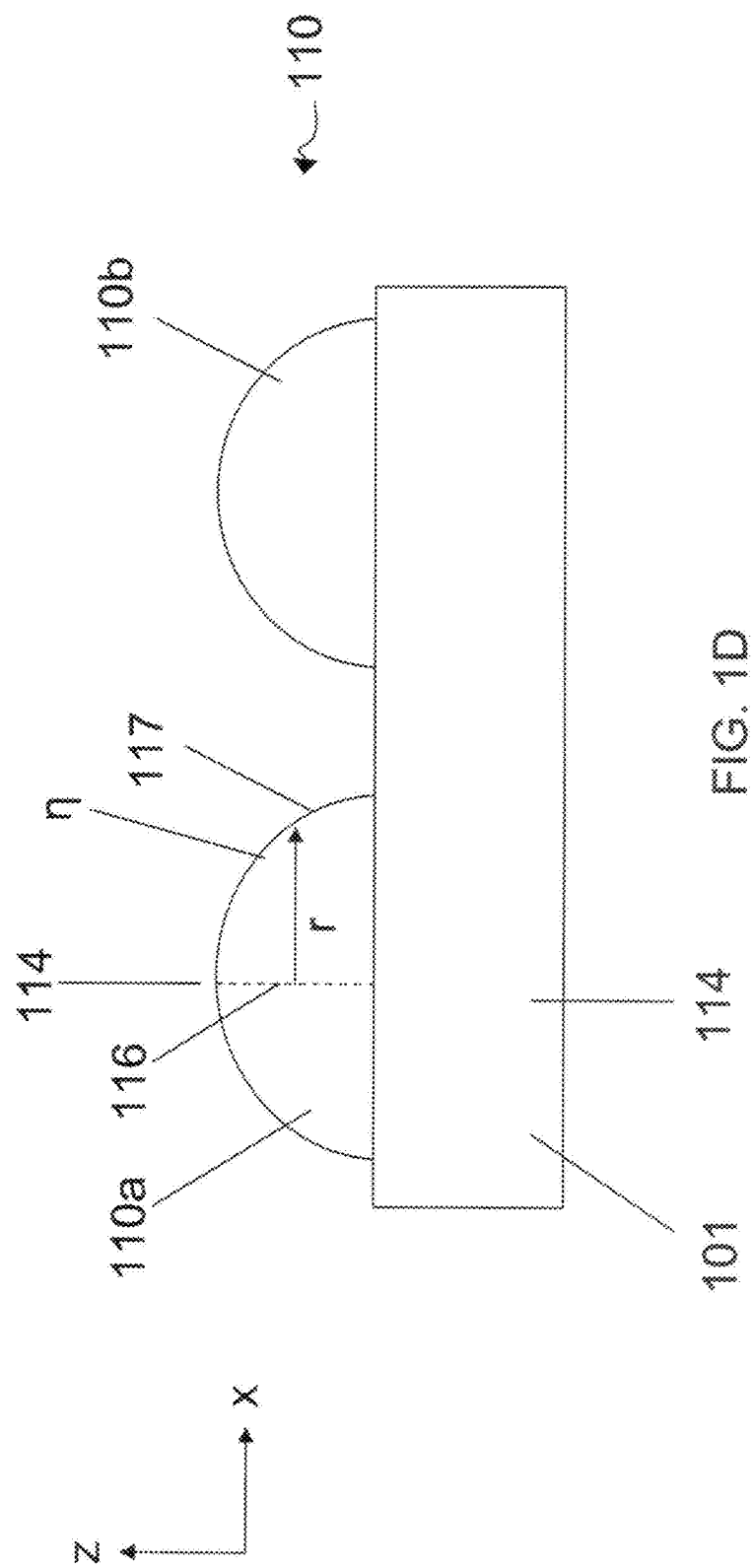

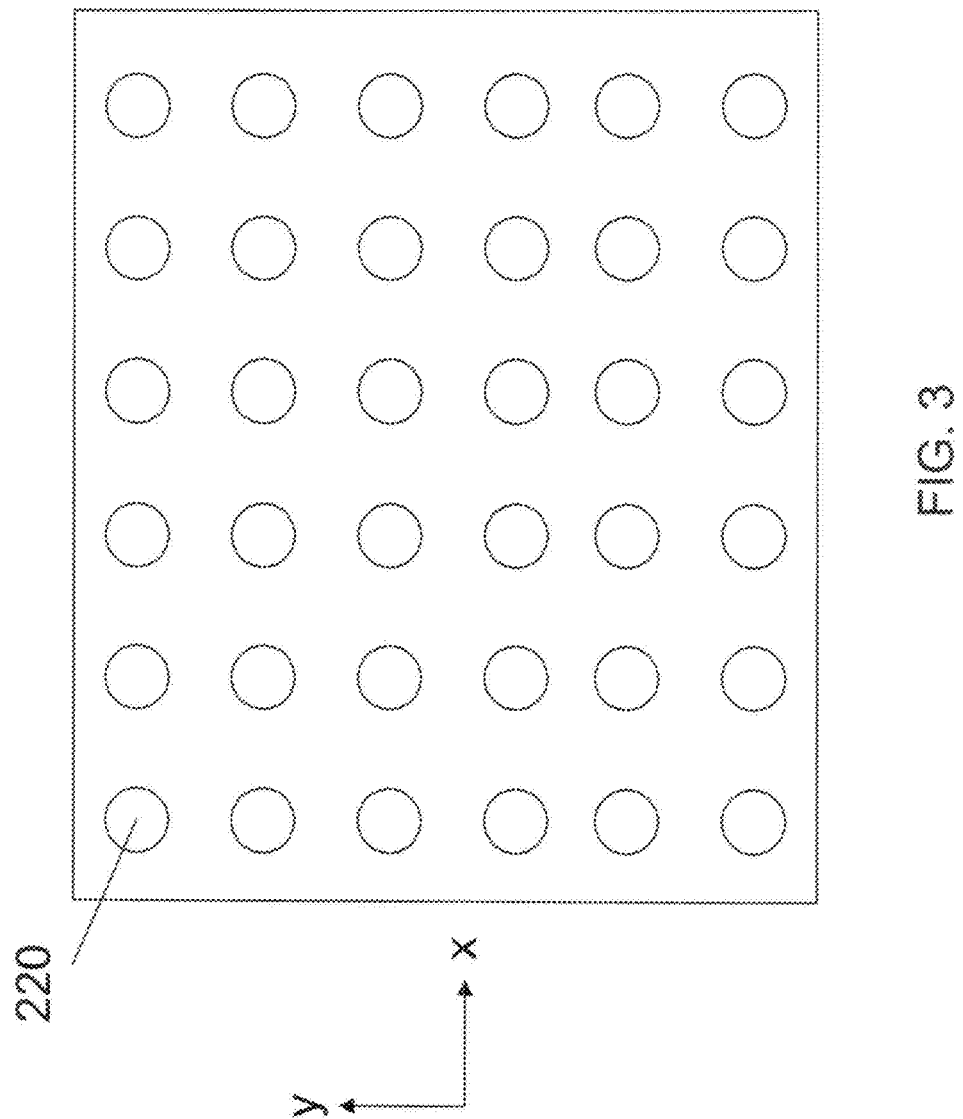

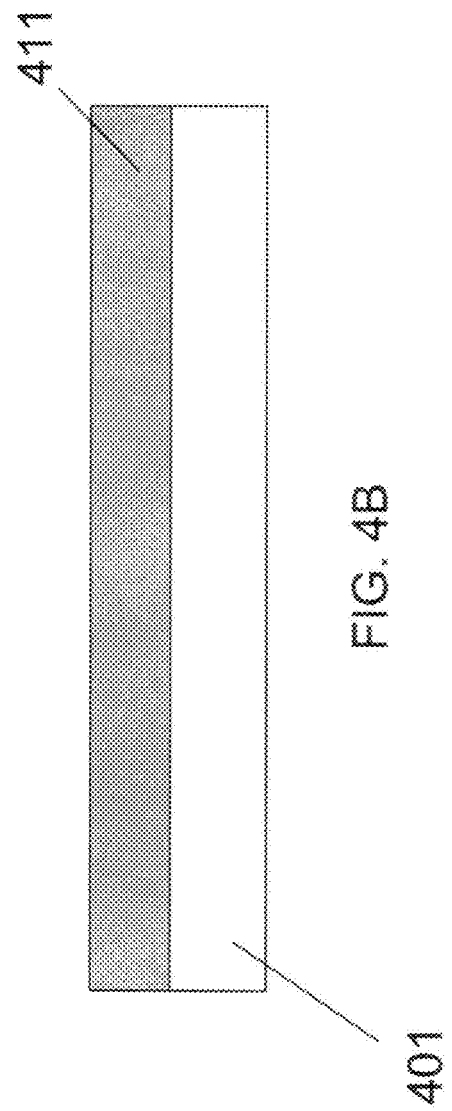

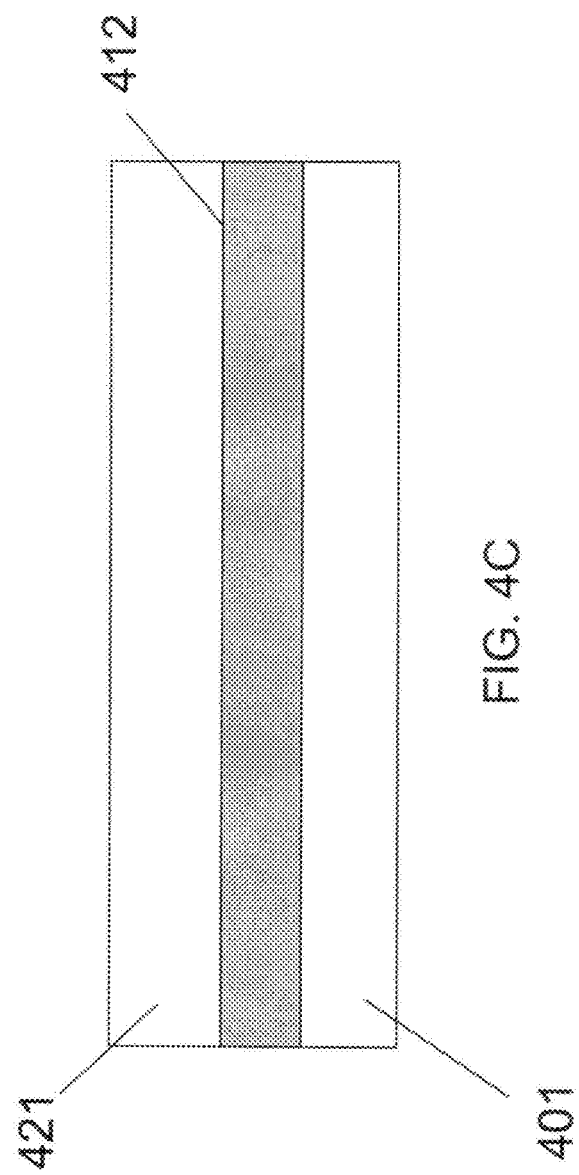

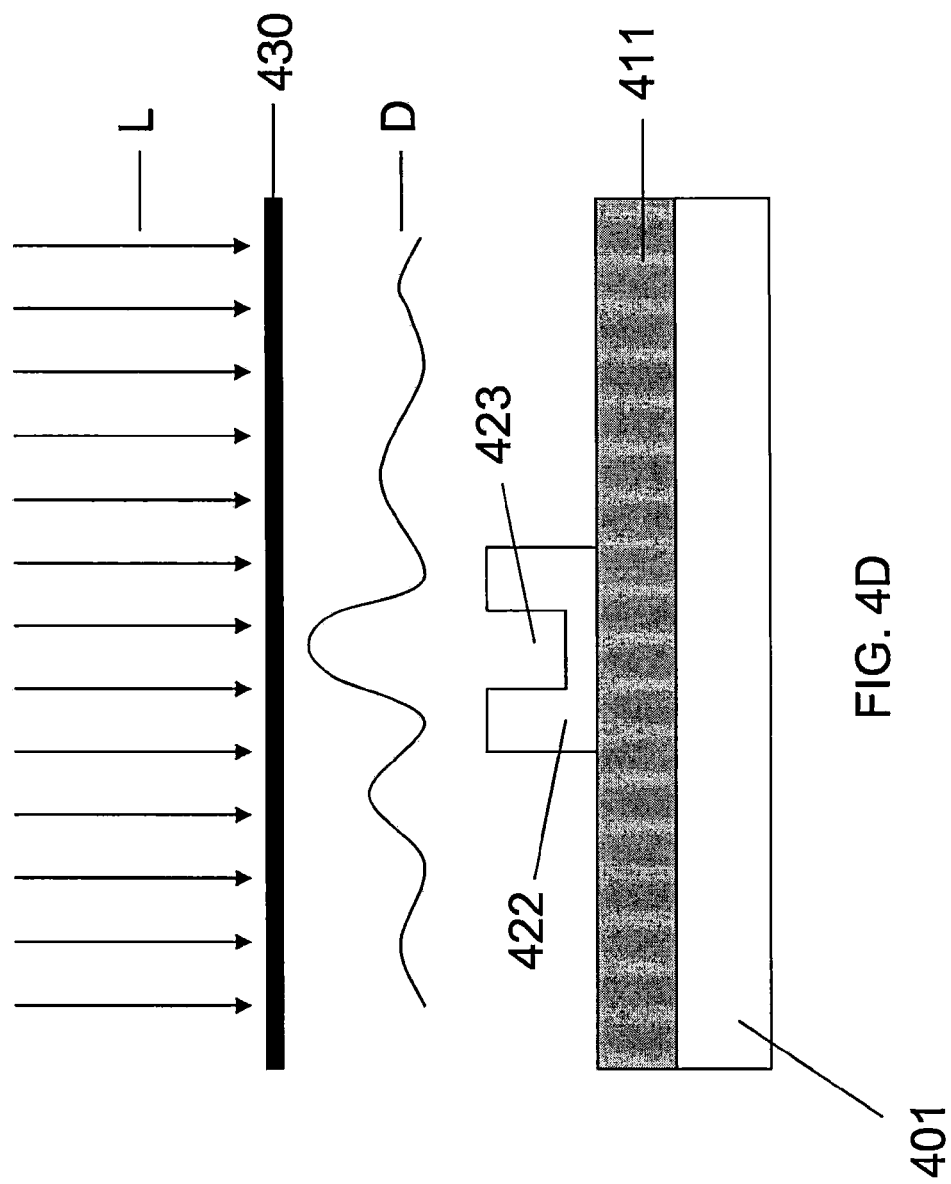

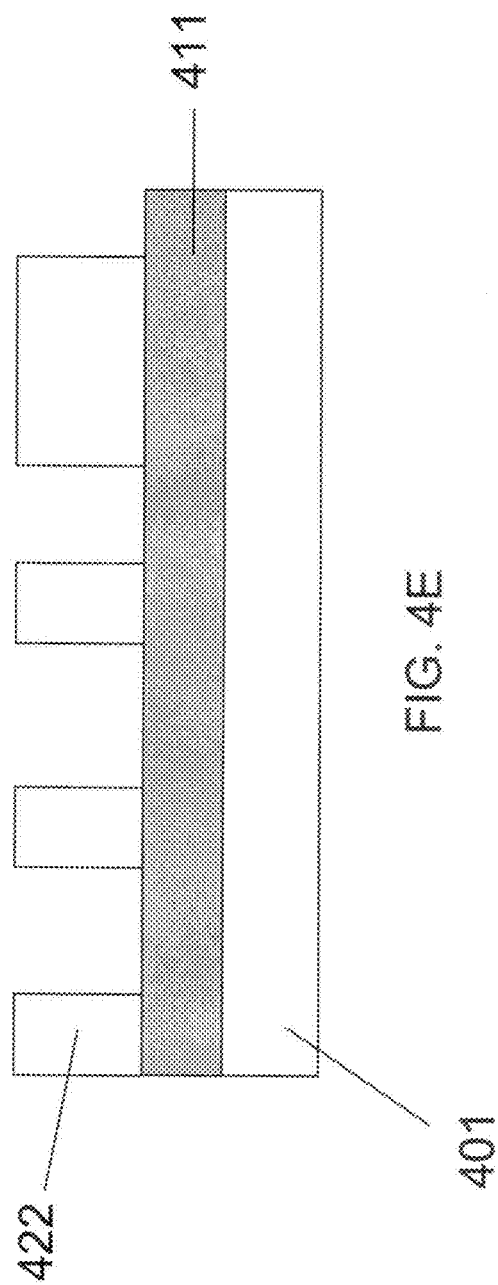

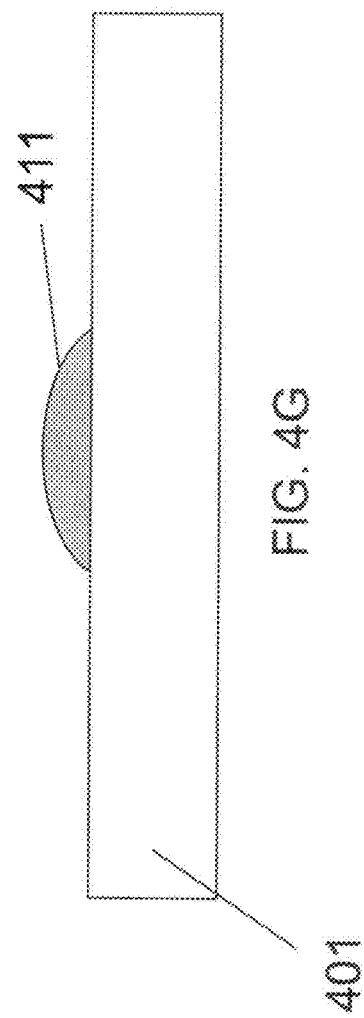

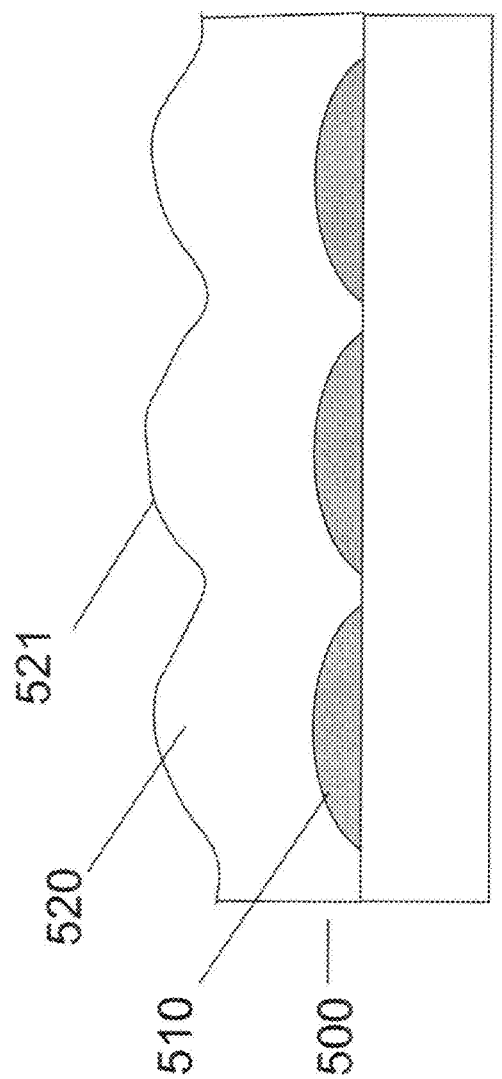

POST ARRAYS AND METHODS OF MAKING THE SAME

CROSS-REFERENCE TO RELATED APPLICATIONS

This application claims priority to Provisional Patent Application No. 61/099,121, entitled "POST ARRAYS AND METHODS OF MAKING THE SAME," filed on Sep. 22, 2008, the entire contents of which is incorporated herein by reference.

FIELD OF THE INVENTION

This disclosure relates to post arrays and methods for making post arrays.

BACKGROUND

Multiple posts can be arranged to form a post array. In certain embodiments, post arrays are made by forming multiple posts on a common substrate.

SUMMARY

In general, in one aspect, the invention features a method that includes forming layer of a mask material on a surface of a first layer, patterning the layer of the mask material to obtain a mask feature, the mask feature having a surface comprising a depression, inducing mass transport of the mask material of the mask feature to obtain a modified mask feature, and transferring a profile of the modified mask feature into the first layer to form a first structure.

In general, in another aspect, the invention features a method that includes forming layer of a mask material on a surface of a first layer, patterning the layer of the mask material to obtain a mask feature, inducing mass transport of the mask material of the mask feature to obtain a modified mask feature, and transferring a profile of the modified mask feature into the first layer to form a first structure. The first layer is composed of an amorphous material and the first structure is a post having a base side-wall angle of in a range from about 60 degrees to about 80 degrees.

Implementations of the methods can include one or more of the following features. For example, inducing mass transport of the mask feature can include inducing reflow of the mask feature. Inducing reflow of the mask feature comprises heating the mask, e.g., above a glass transition temperature of the mask material. Inducing reflow of the mask feature can reduce a contact angle of the mask feature to between 60 and 80 degrees. The method can include cooling the modified mask feature to inhibit reflow prior to transferring the profile of the modified mask feature.

Transferring the profile into the first layer can include etching the first layer. Transferring the profile into the first layer can include anisotropically etching the first layer. For example, the anisotropic etching can include reactive ion etching.

The methods can include forming a layer of a second material on a surface of the first structure to form a lens. The layer of the second material can be formed using atomic layer deposition. The lens can include multiple layers of different dielectric materials.

The first can be composed of an amorphous material. The amorphous material can be an inorganic, amorphous material. The amorphous material can be a glass. In some embodiments, the surface of the modified mask feature does not comprise a depression.

The methods can include applying a hydrophobic monolayer to the surface of the first layer prior to depositing the mask material.

The methods can include applying a hydrophilic monolayer to the surface of the first layer prior to depositing the mask material.

Patterning the mask material can include applying photolithograpy to the mask material. Applying photolithography can include using a brightfield mask between a light source and the mask material. Patterning the mask material can include pre-shaping the mask feature. For example, pre-shaping the mask feature can include plasma etching the mask feature.

DESCRIPTION OF DRAWINGS

FIG. 1D is a cross-sectional view of a post in the post array shown in FIG. 1A.

FIG. 3 is a plan view of a post array.

FIGS. 4A-4G show steps in the manufacture of a post array.

FIG. 5 shows an example of a lens array formed on a post array.

Like reference symbols in the various drawings indicate like elements.

DETAILED DESCRIPTION

Figure 1A:
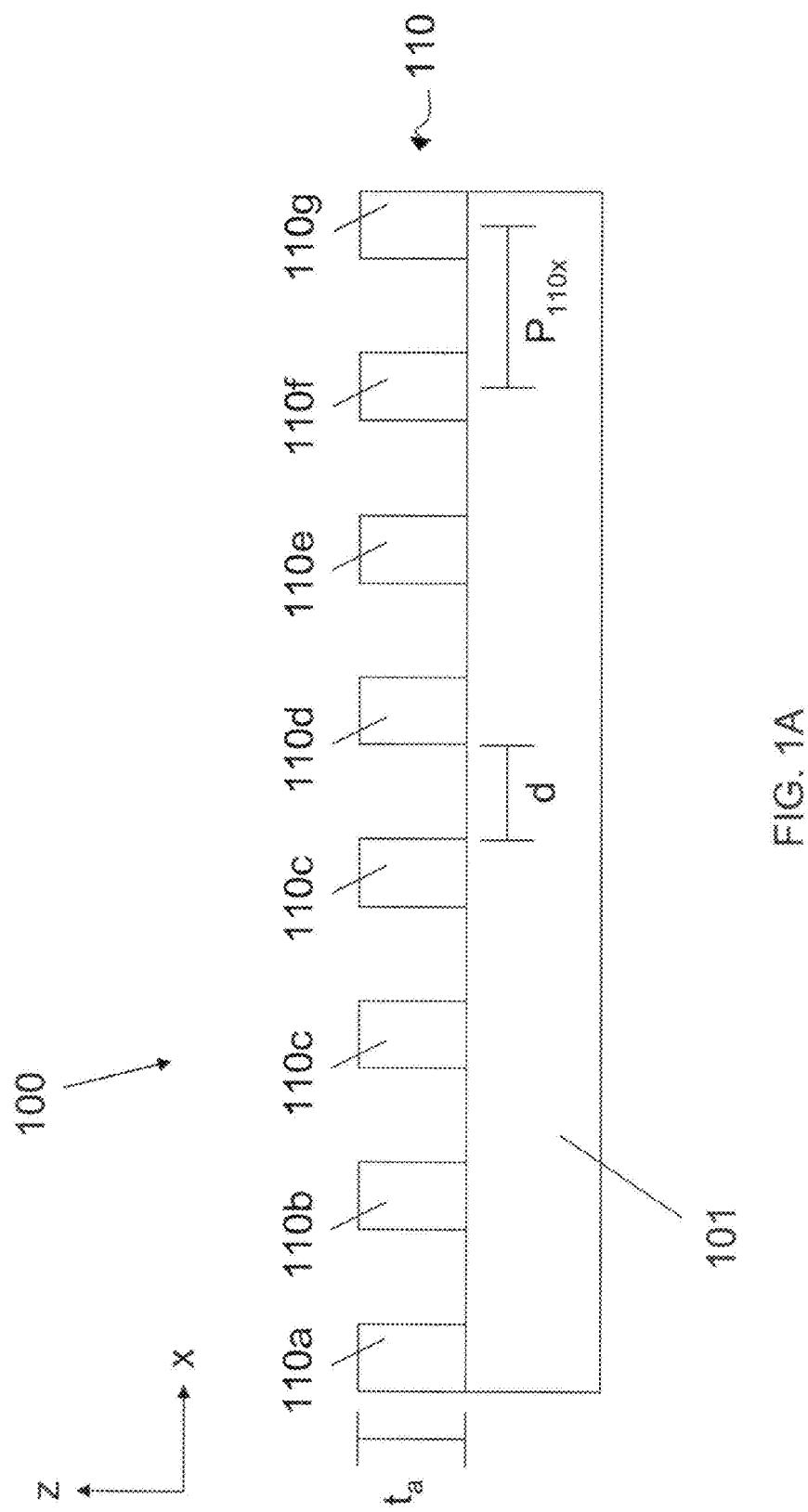
FIG. 1A is a cross-sectional view of a portion of an embodiment of a post array.

Referring to FIG. 1A, a post array 100 includes a number of posts 110a-110h formed in a surface of a post layer 111. Post array 100 also includes a substrate 101, which supports post layer 111. As discussed below, in certain embodiments, posts 110a-110h are formed by depositing a mask material onto post layer 111, modifying the mask shape and etching the post layer 111. Posts 110a-110h are portions of layer 111 that are not removed as a result of the etch. It is believed that the size and shape of posts 110a-110h are thus related to parameters including, but not limited to: mask material, shape, size and etch selectivity; post layer material, thickness and etch selectivity; and etch type, duration and conditions.

Figure 1B:
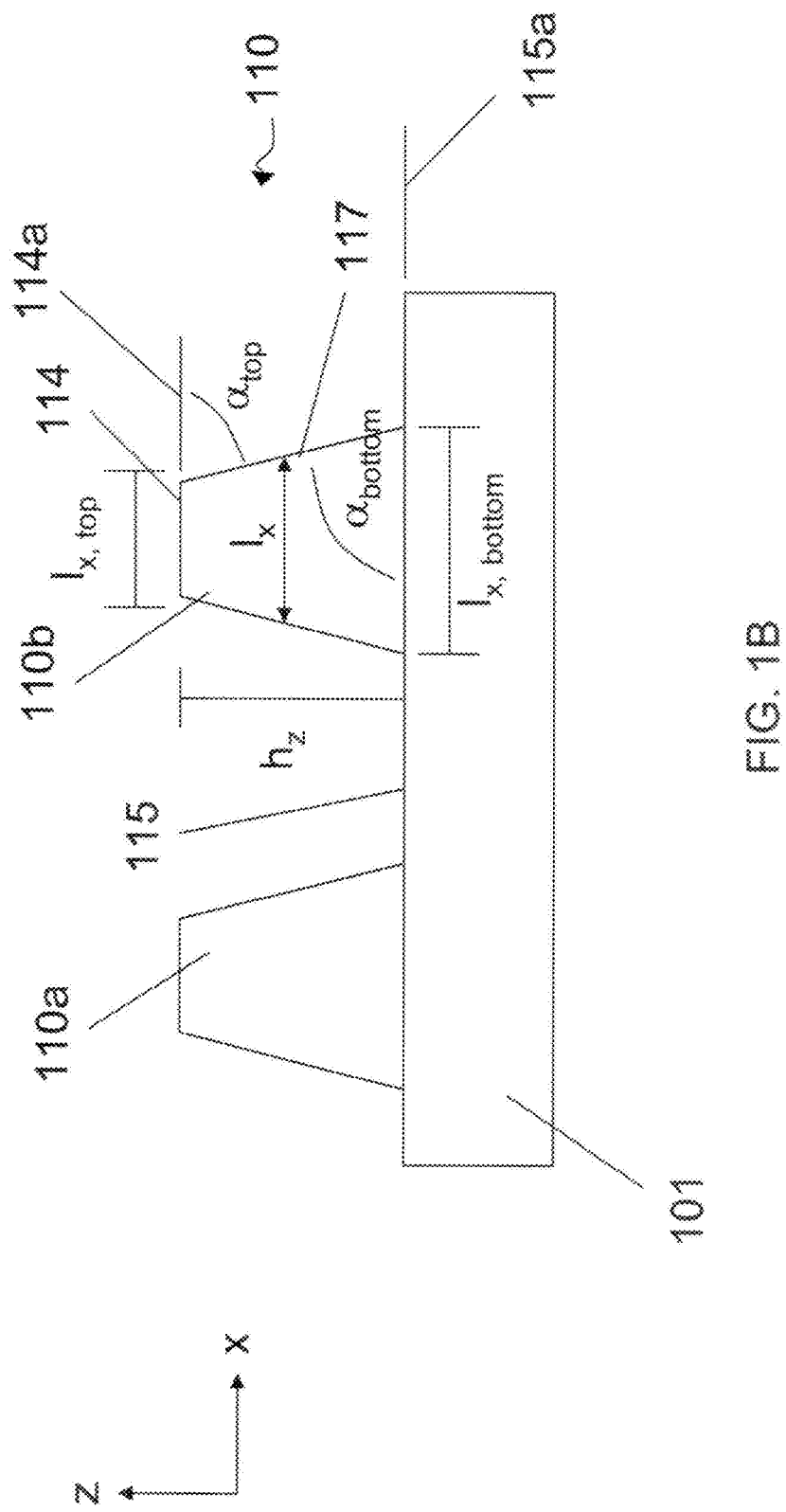
FIG. 1B is a cross-sectional view of a post in the post array shown in FIG. 1A.

FIGS. 1A and 1B also show a Cartesian coordinate system, which is referred to in the description of post array 100. FIGS. 1A and 1B show a portion of post array 100 in cross-section through the x-z plane. In some embodiments, the cross-section of post array 100 through the y-z plane is substantially the same as the cross-section through the x-z plane.

Figure 8A:
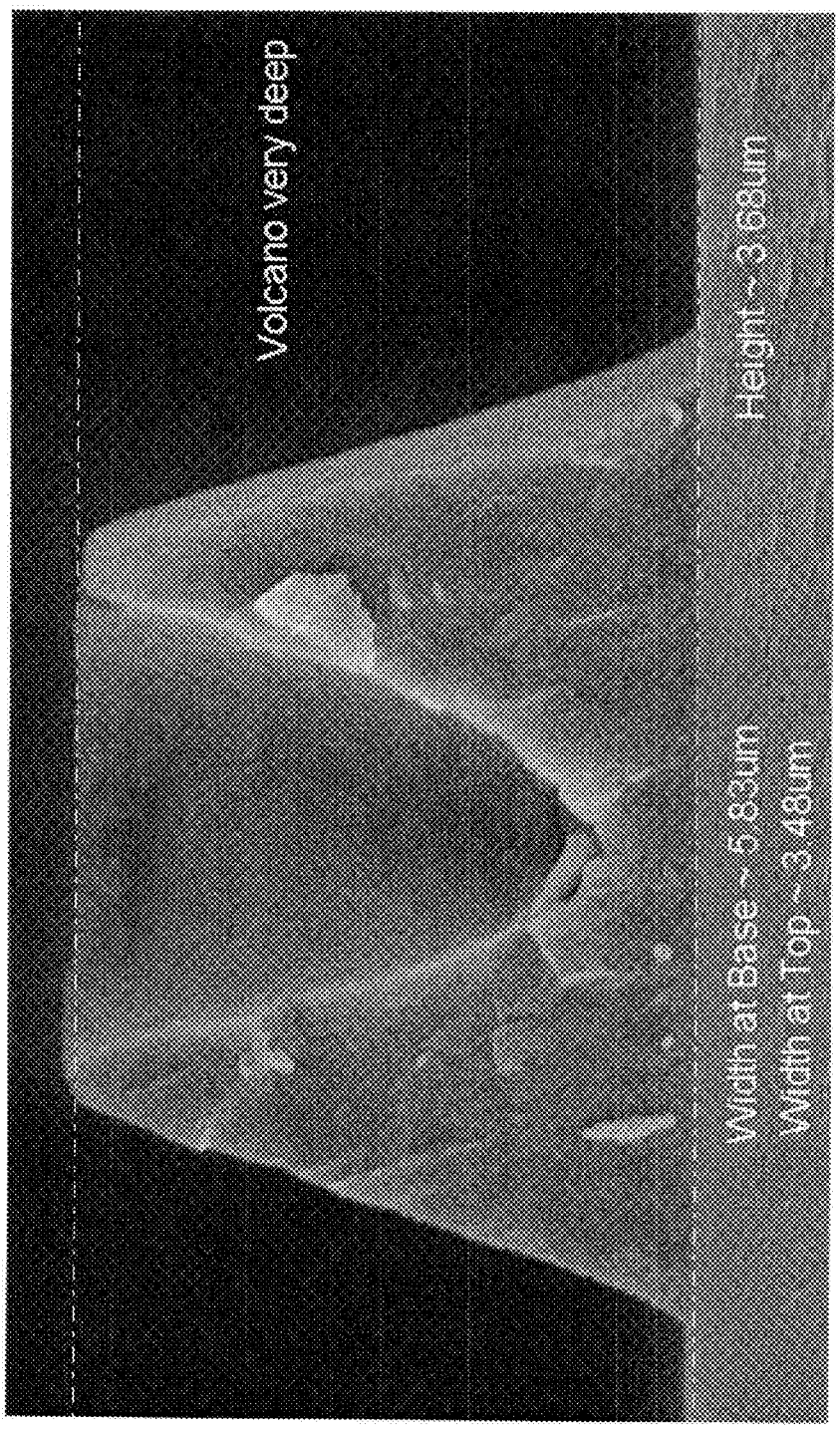
FIG. 8A shows a scanning electron micrograph (SEM) of an exemplary resist structure that includes a depression.
Figure 8B:
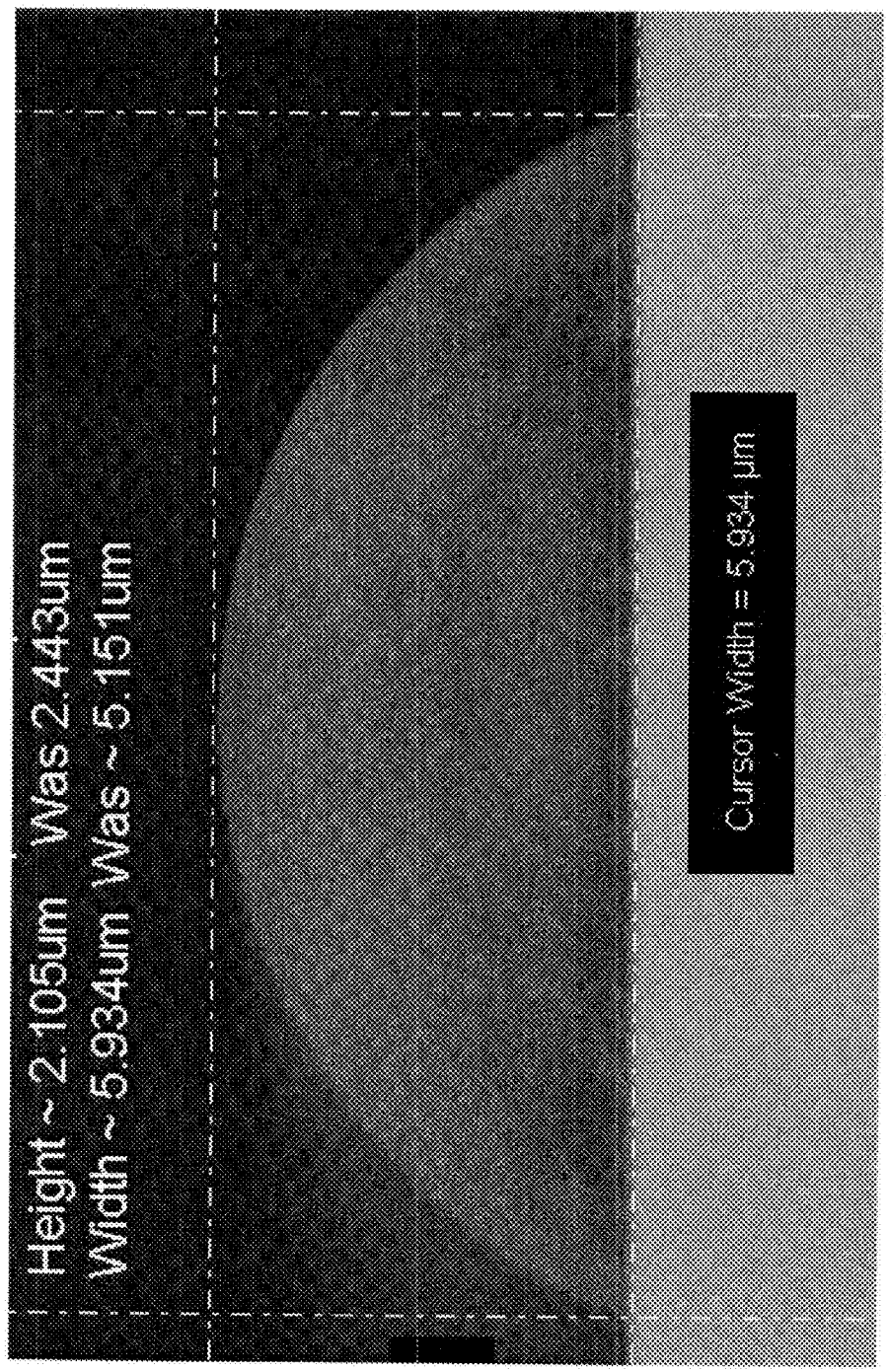
FIG. 8B shows an SEM of an exemplary mask feature that has been re-shaped using such a reflow process.
Figure 8C:
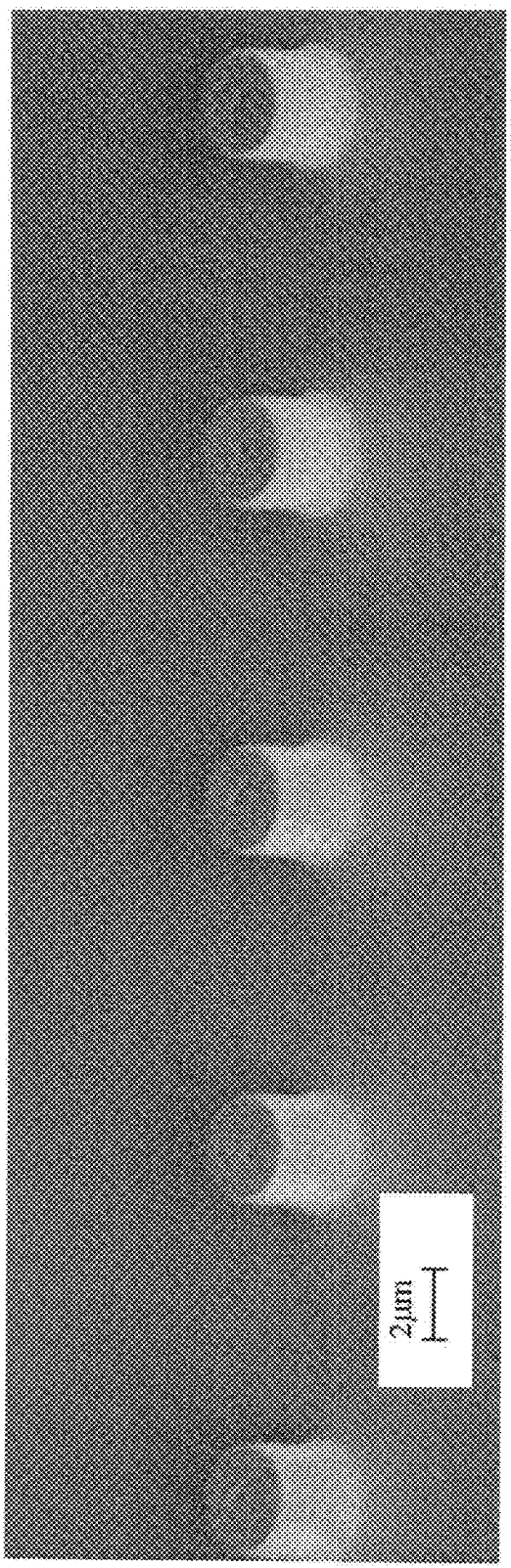
FIG. 8C shows an SEM of an exemplary array of posts.

While only eight posts are shown in the post array 100 in FIG. 1A, in general, post arrays can include fewer or more posts. In some embodiments, post arrays include tens or hundreds of posts. In certain embodiments, post arrays include hundreds of thousands to millions of posts. The number of posts, and their arrangement in the array, are generally determined based on the application of the post array. Arrangements of posts in post arrays and applications of post arrays are discussed below. FIG. 8C shows an scanning electron micrograph (SEM) of an exemplary array of posts.

In general, the dimensions of post array 100 along the x-, y-, and z-axes can vary as desired. Along the z-axis, post array 100 has a thickness $t_a$. $t_a$ corresponds to the height of the tallest post in post array 100. $t_a$ can be, for example, about 50 µm or less (e.g., about 40 µm or less, about 30 µm or less, about 20 µm or less, about 10 µm or less, about 5 µm or less, about 3 µm or less, about 2 µm or less, about 1 µm or less, about 0.5 µm or less, about 0.3 µm or less, about 0.2 µm or less). In certain embodiments, $t_a$ is in a range from about 1 µm to about 5 µm (e.g., from about 2 µm to about 4 µm).

In general, each of the posts in the array is separated along the x- and/or y-axis by a distance d. For example, d can be about 50 µm or less (e.g., about 30 µm or less, about 20 µm or less, about 15 µm or less, about 10 µm or less, about 8 µm or less, about 5 µm or less, about 3 µm or less, about 2 µm or less, about 1 µm or less, about 0.8 µm or less, about 0.6 µm or less, about 0.4 µm or less, about 0.2 µm or less). In some cases, the distance d between each post need not be fixed. That is, the distance d between each post can vary across the post array 100.

In some embodiments, the posts of the array can be arranged at regular intervals along the x- and/or y-axis with a periodicity P. The spatial period, $P_{110x}$ of the posts in the x-direction is shown for adjacent posts 110f and 110g in FIG. 1A. Post array 100 can have a corresponding period, $P_{110y}$, in the y-direction (not shown). In general, $P_{110x}$ can be the same as or different than $P_{110y}$. In some embodiments, $P_{110x}$ and/or $P_{110y}$ are in a range from about 100 nm to about 100 µm. For example, $P_{110x}$ and/or $P_{110y}$ can be about 200 nm or more (e.g., about 500 nm or more, about 800 nm or more, about 1 µm or more, about 2 µm or more, about 5 µm or more, about 10 µm or more, about 20 µm or more). $P_{110x}$ (and/or $P_{110y}$ can be about 80 µm or less (e.g., about 60 µm or less, about 50 µm or less, about 40 µm or less, about 30 µm or less).

In certain embodiments, post array 100 extends substantially further in the x- and/or y-directions than it does in the z-direction. For example, post array 100 can extend for about 0.5 cm or more (e.g., about 1 cm or more, about 2 cm or more, about 3 cm or more, about 5 cm or more, about 10 cm or more) in the x- and/or y-directions, while $t_a$ is about 1 mm or less.

Referring specifically to FIG. 1B, a post 110b can be characterized by a first and second lateral dimension, $l_x$ and $l_y$ (not shown), where $l_x$ represents a length of the post in the x-direction and $l_y$ represents a length of the post in the y-direction. In general, $l_x$ can be the same or different than $l_y$. In some embodiments, $l_x$ and/or $l_y$ is constant from a top surface 114 of the post to a bottom surface 115 of the post. For example, the posts have a rectangular cross-sectional profile through at least one section. In certain embodiments, $l_x$ and/or $l_y$ can vary from the post top surface 114 to the post bottom surface 115. For example, each post can be characterized by a second and third lateral dimension, $l_{x,\ top}$ and $l_{x,\ base}$, where $l_{x,\ top}$ is a length along a top surface 114 of the post in the x-direction and $l_{x,\ base}$ is a length along a base surface 115 of the post in the x-direction. Similarly, each post also can be characterized by a fifth and sixth lateral dimension, $l_{y,\ top}$ and $l_{y,\ base}$ (not shown), which respectively represent a length along a top and bottom surface of the post in the y-direction.

In general, $l_{x,\ top}$ and $l_{y,\ top}$ can be the same as or different than $l_{x,\ base}$ and $l_{y,\ base}$, respectively. Similarly, $l_{x,\ top}$ and $l_{x,\ base}$ can be the same as or different than $l_{y,\ top}$ and $l_{y,\ base}$, respectively. For example, in some embodiments, the post can have a shape similar to a trapezoid where $l_{x,\ top}$ is less than $l_{x,\ bottom}$. In some embodiments, $l_x$, $l_y$, $l_{x,\ top}$, $l_{y,\ top}$, $l_{x,\ base}$, and/or $l_{y,\ base}$ is about 100 µm or less (e.g., about 80 µm or less, about 70 µm or less, about 60 µm or less, about 50 µm or less, about 40 µm or less, about 30 µm or less, about 20 µm or less, about 10 µm or less, about 5 µm or less, about 3 µm or less, about 2 µm or less, about 1 µm or less, about 0.5 µm or less, about 0.3 µm or less, about 0.2 µm or less).

Figure 1C:
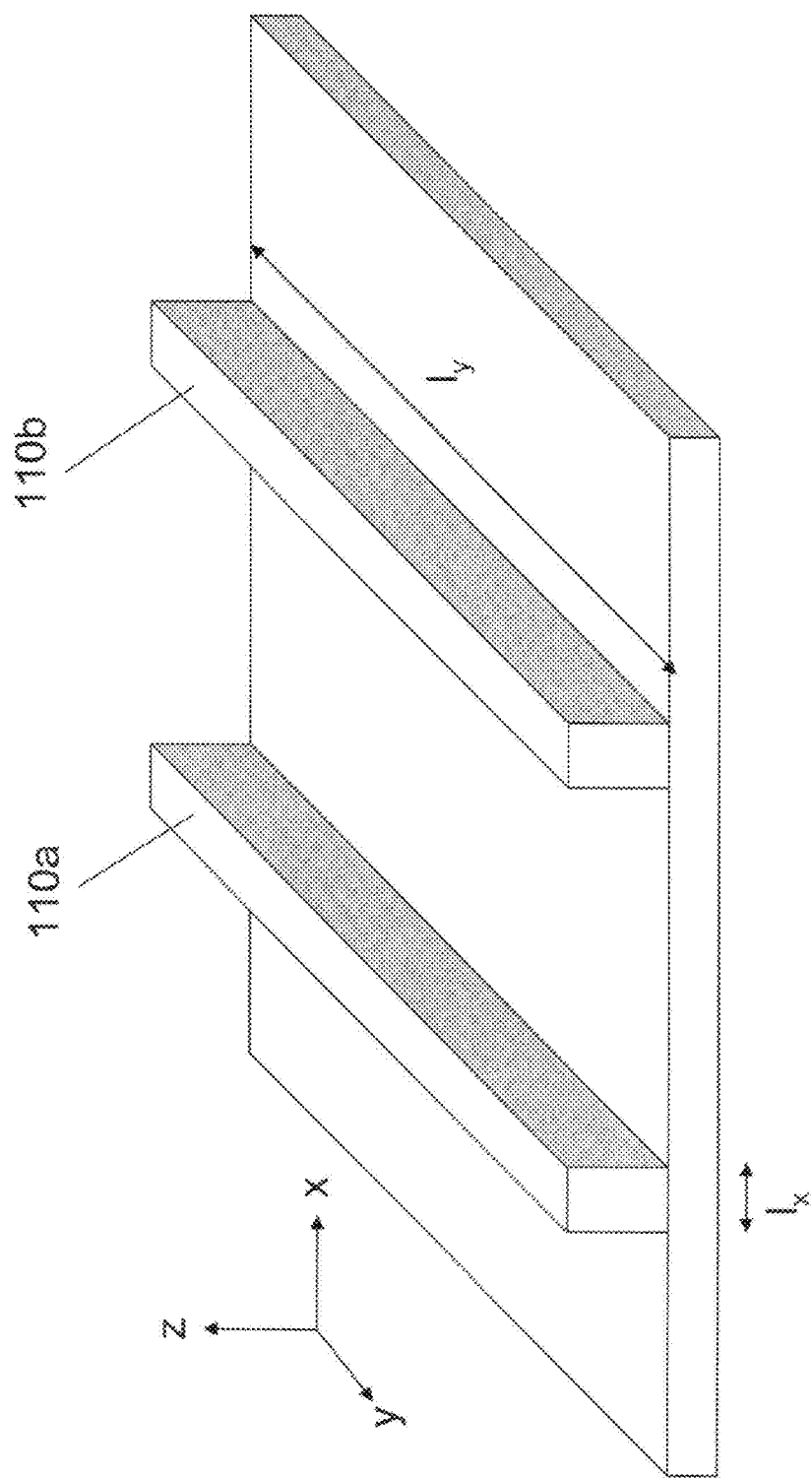
FIG. 1C is an isometric view of posts in the post array shown in FIG. 1A.

In some embodiments the second lateral dimension $l_y$ is substantially larger than the first lateral dimension $l_x$. For example, FIG. 1C shows an isometric view of posts 110a, 110b in which $l_y$ is much larger than $l_x$. Accordingly, the posts have a "ridge" shape separated by an elongated channel 118. In other words, in certain embodiments, the posts can form a one-dimensional array.

Referring again to FIG. 1B, each post also has a vertical dimension, $h_z$, which refers to the maximum dimension of the post along the z-axis from the base 115 between adjacent posts. In general, $h_z$ is the same as or less than $t_a$. In certain embodiments, $h_z$ is about 50 µm or less (e.g., about 40 µm or less, about 30 µm or less, about 20 µm or less, about 10 µm or less, about 5 µm or less, about 3 µm or less, about 2 µm or less, about 1 µm or less, about 0.5 µm or less, about 0.3 µm or less, about 0.2 µm or less). $h_z$ can be the same or different for each post in post array 100.

A sidewall 117 of each post may be characterized by a top sidewall angle $\alpha_{top}$ and a bottom sidewall angle $\alpha_{bottom}$. In general, sidewall angle $\alpha_{top}$ represents the angle between the post sidewall 117 and a plane 114a extending horizontally along the uppermost portion of the post top surface 114. Sidewall angle $\alpha_{bottom}$ represents an angle between the post sidewall 117 and a plane 115a extending horizontally along the post base surface 115. $\alpha_{top}$ can be the same as or different than $\alpha_{bottom}$. In some embodiments, $\alpha_{top}$ can be 90° or less (e.g., about 80° or less, about 70° or less, about 60° or less, about 50° or less, about 40° or less, about 30° or less). In some cases, $\alpha_{bottom}$ can be 90° or less (e.g., about 80° or less, about 70° or less, about 60° or less, about 50° or less, about 40° or less, about 30° or less). In certain embodiments, $\alpha_{bottom}$ can be in a range from about 45° to about 80° (e.g., from about 50° to about 85°, from about 60° to about 80°, from about 65° to about 75°, from about 68° to about 73°).

While side walls 117 as shown in FIGS. 1A-1C is depicted as having a straight cross-sectional shape, in general, post side walls can be straight or curved. For example, referring to FIG. 1D, the post sidewall 117 may be characterized by a radius of curvature, $r_1$, for each point on the post surface. Accordingly, in some cases, the post is shaped similar to a spherical lens, in which $r_1$ is substantially constant over the surface of the post and rotationally symmetric with respect to the post axis 116. Alternatively, where the surface of the post is aspherical, $r_1$ varies over the post surface.

In certain embodiments, the cross-sectional shape of side walls 117 can approximate a smoothly varying curve, such as a Gaussian shape or a parabolic shape.

In some embodiments, post 110 is a rotationally-symmetrical aspherical lens, in which case post 110 is continuously rotationally symmetric with respect to post axis 116. In some embodiments, $r_1$ is about 100 µm or less (e.g., about 80 µm or less, about 70 µm or less, about 60 µm or less, about 50 µm or less, about 40 µm or less, about 30 µm or less, about 20 µm or less, about 10 µm or less, about 8 µm or less, about 5 µm or less, about 4 µm or less, about 3 µm or less, about 2 µm or less, about 1 µm or less, about 0.5 µm or less, 0.3 µm or less, 0.2 µm or less).

In some implementations, the post sidewall 117 can be characterized by a post radius r which extends laterally from a post axis 116, parallel to the z-axis. Accordingly, the post 110 may be shaped similar to a cylinder, in which r is substantially constant and rotationally symmetric with respect to the post axis 116. Alternatively, where the post is conical, r increases from the post top surface 114 to the post base 115. In some embodiments, r is about 50 µm or less (e.g., about 40 µm or less, about 30 µm or less, about 20 µm or less, about 10 µm or less, about 5 µm or less, about 3 µm or less, about 2 µm or less, about 1 µm or less, about 0.5 µm or less, about 0.3 µm or less, about 0.2 µm or less).

Figure 1E:
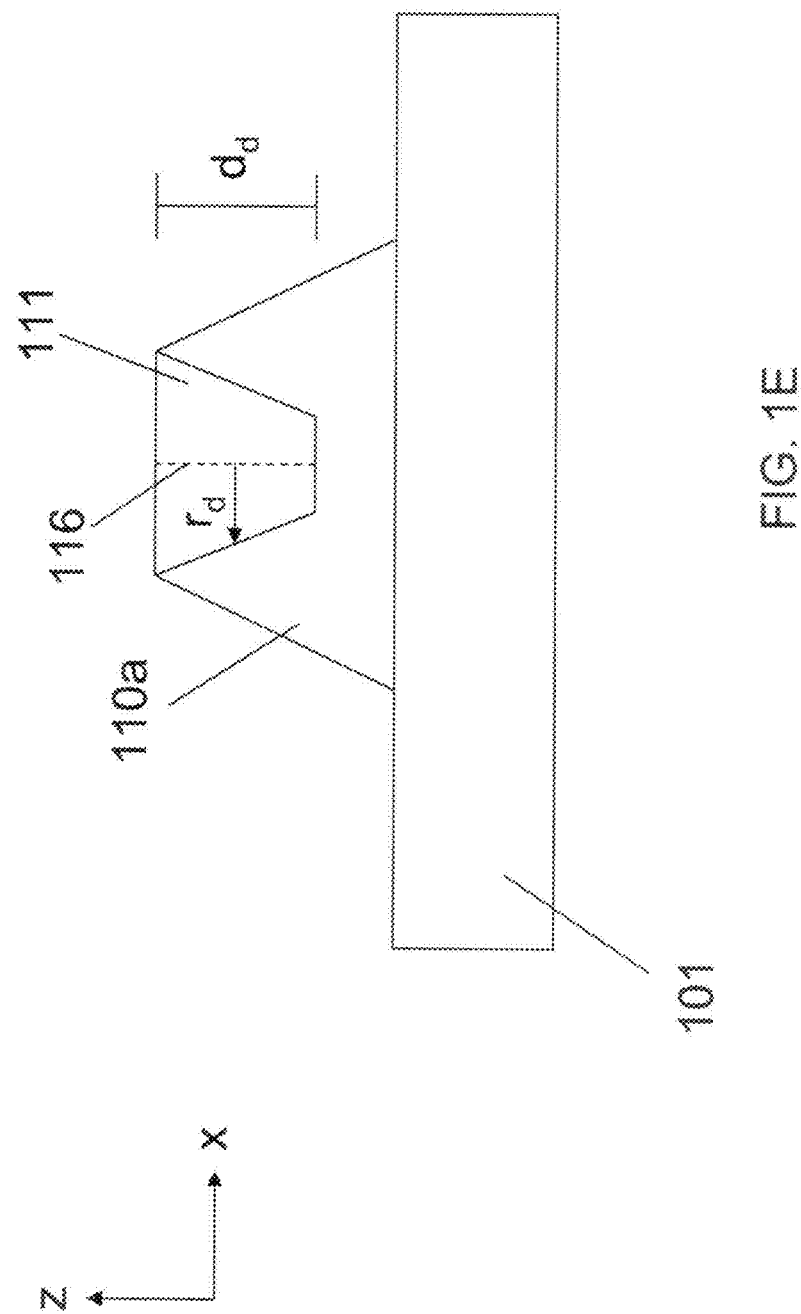
FIG. 1E is a cross-sectional view of a post in the post array shown in FIG. 1A.

In some implementations, a post may include a depression in its center. For example, FIG. 1E shows a cross-section of a rotationally symmetric post 110a along the x-z plane, in which a depression or hole 111 is formed in the post top surface 114. The depression may be characterized by a radius $r_d$ that extends laterally from the depression center 116 to an inner surface of the post. In some cases, the radius $r_d$ is substantially uniform for the entire post height. Alternatively, $r_d$ may vary with the depression depth $d_d$. In some embodiments, $r_d$ can be about 30 µm or less (e.g., about 20 µm or less, about 10 µm or less, about 5 µm or less, about 3 µm or less, about 2 µm or less, about 1 µm or less, about 0.5 µm or less, about 0.3 µm or less, about 0.2 µm or less). The depression depth $d_d$ can be equal or less than the post height. For example, in some embodiments, $d_d$ can be about 10 µm or less (e.g., about 5 µm or less, about 3 µm or less, about 1 µm or less, about 0.5 µm or less, about 0.1 µm or less).

Turning now to the composition of post array 100, each post 110 can be formed from materials selected based on a variety of factors, including material crystallinity, optical properties, material compatibility with processes used to form post array 100, and material compatibility with other materials used to form post array 100. In some implementations, post 110 is formed from amorphous materials including inorganic and/or organic amorphous materials. Amorphous materials include amorphous dielectric materials that are optically isotropic. In certain embodiments, amorphous dielectric materials may transmit certain wavelengths of light better than portions of materials having similar composition that are partially or mostly crystalline. Examples of inorganic amorphous materials include materials such as glass, quartz, $SiO_2$, $TiO_2$ or amorphous Si. Examples of organic amorphous materials include polymers such as polyimides, polysterenes, and polycarbonate. Alternatively, in certain embodiments, post 110 can be formed from a crystalline or semi-crystalline material such as crystalline or poly-crystalline Si.

In some implementations, post 110 can be formed from one or more optically transmissive materials, including inorganic and/or organic optically transmissive materials. As used herein, optically transmissive materials are materials that, for a 1 mm thick layer, transmit about 50% or more (e.g., about 80% or more, about 90% or more, about 95% or more) normally incident radiation at λ.

In some embodiments, post 110 includes one or more dielectric materials, such as dielectric oxides (e.g., metal oxides), fluorides (e.g., metal fluorides), sulphides, and/or nitrides (e.g., metal nitrides). Examples of oxides include $SiO_2$, $Si_3N_4$, $Al_2O_3$, $Nb_2O_5$, $TiO_2$, $ZrO_2$, $HfO_2$, $SnO_2$, $ZnO$, $ErO_2$, $Sc_2O_3$, and $Ta_2O_5$. Examples of fluorides include $MgF_2$. Other examples include ZnS, $SiN_x$, $SiO_yN_x$, AlN, TiN, and HfN.

Post 110 can be formed from a single material or from multiple different materials. In some embodiments, post 110 is formed from a nanolaminate material, which refers to a composition that is formed of layers of at least two different materials and the layers of at least one of the materials are extremely thin (e.g., between one and about 10 monolayers thick). Nanolaminate materials can be formed using atomic layer deposition (ALD). Optically, nanolaminate materials have a locally homogeneous index of refraction that depends on the refractive index of its constituent materials. Varying the amount of each constituent material can vary the refractive index of a nanolaminate. Examples of nanolaminate portions include portions composed of $SiO_2$ monolayers and $TiO_2$ monolayers, $SiO_2$ monolayers and $Ta_2O_5$ monolayers, or $Al_2O_3$ monolayers and $TiO_2$ monolayers.

Figure 2:
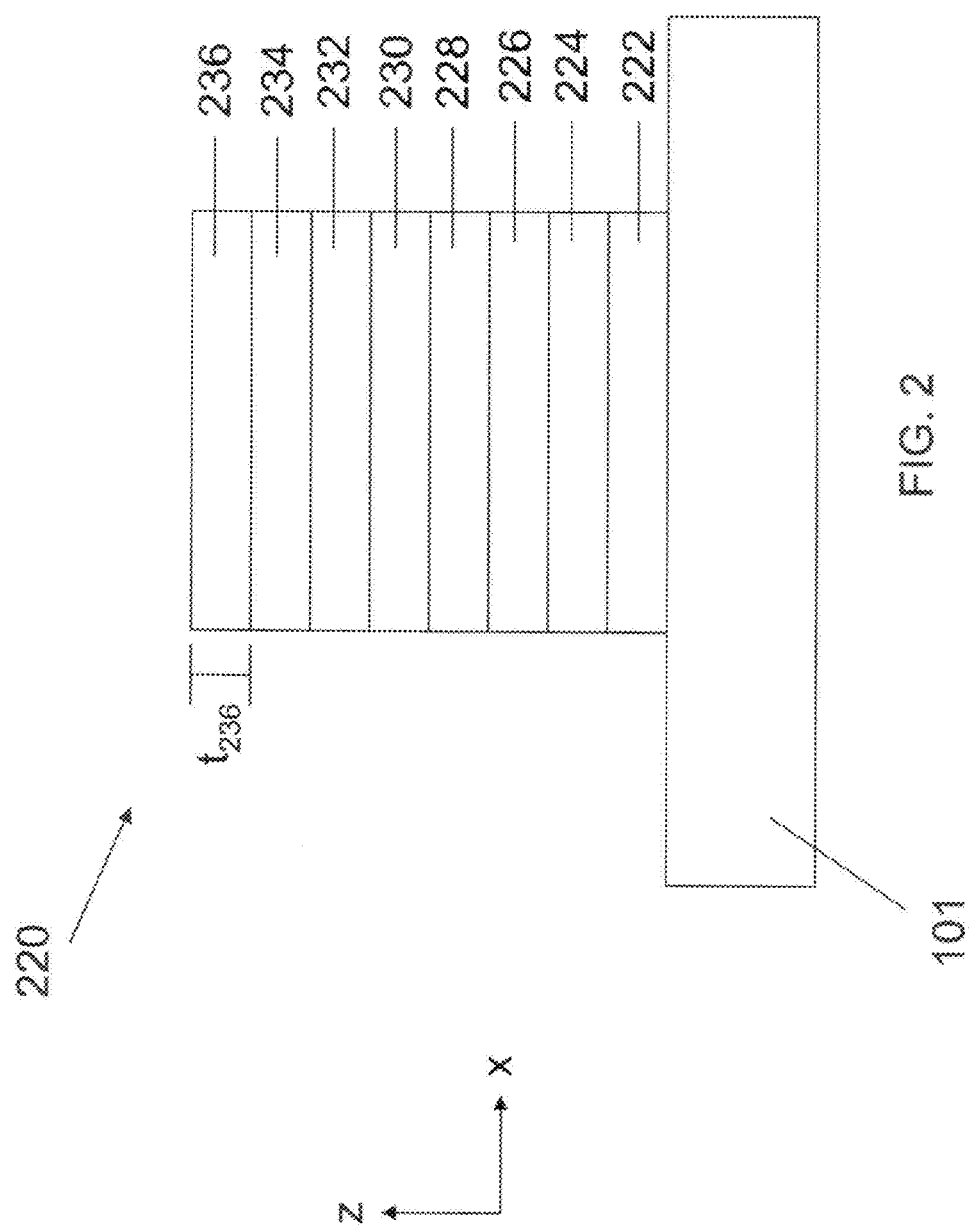
FIG. 2 is a cross-sectional view of a post formed of more than one material.

Referring to FIG. 2, an example of a post 220 formed from more than one material is shown. In this example, post 220 includes eight sub-layers 222, 224, 226, 228, 230, 232, 234, and 236. Each sub-layer has a thickness, $t_z$, measured along an axis parallel to the z-direction, as illustrated by $t_{236}$ for sub-layer 236. More generally, the number of sub-layers in a post can vary as desired. In some embodiments, a post can include more than eight sub-layers (e.g., about 10 sub-layers or more, about 20 sub-layers of more, about 30 sub-layers or more, about 40 sub-layers or more, about 50 sub-layers or more, about 60 sub-layers or more, about 70 sub-layers or more, about 80 sub-layers or more, about 90 sub-layers or more, about 100 sub-layers or more).

The thickness, $t_z$, and composition for each sub-layer can vary as desired. In some embodiments, the thickness, $t_z$, of each sub-layer in post 220 is about 5 nm or more (e.g., about 10 nm or more, about 20 nm or more, about 30 nm or more, about 50 nm or more, about 70 nm or more, about 100 nm or more, about 150 nm or more, about 200 nm or more, about 300 nm or more).

Referring to FIG. 3, posts 110 can be periodically spaced in both the x-direction and the y-direction. In some embodiments, the posts can be arranged in a square grid pattern, a rectangular grid pattern, or a hexagonal pattern. In some embodiments the posts 110 can be ridges in which ridges arranged along the x-direction intersect with ridges arranged along the y-direction.

Figure 4A:
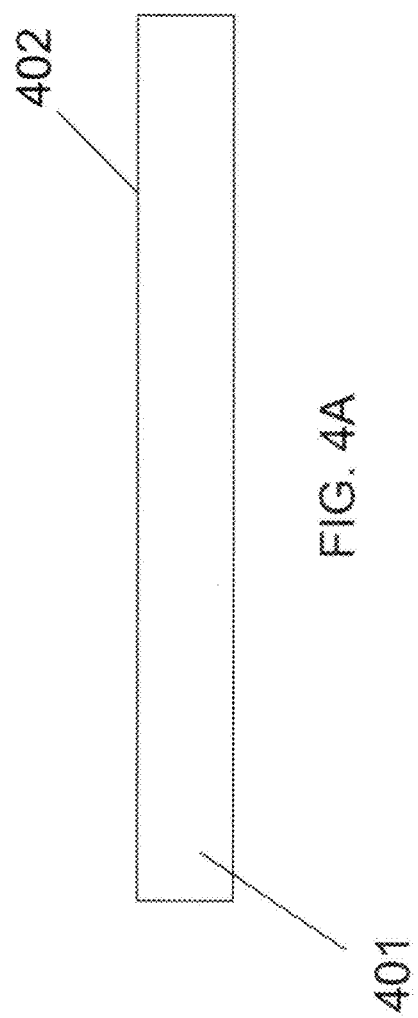

In general, post arrays can be prepared using a variety of methods. FIGS. 4A-4G show a method of fabricating a post array. Initially, a substrate 401 is provided, as shown in FIG. 4A. Surface 402 of substrate 401 can be polished and/or cleaned (e.g., by exposing the substrate to one or more solvents, acids, ultraviolet radiation, ozone and/or baking the substrate).

Referring to FIG. 4B, a post layer 411 is deposited on the surface 402 of the substrate 401. The material forming the post layer 411 can be formed using one of a variety of techniques, including sputtering (e.g., radio frequency sputtering), evaporation (e.g., electron beam evaporation, ion assisted deposition (IAD), thermal evaporation), chemical vapor deposition (CVD) (e.g., plasma enhanced CVD (PECVD), low pressure CVD (LPCVD), atmospheric CVD (ACVD), rapid thermal CVD (RTCVD)), or atomic layer deposition (ALD). As an example, a layer of $SiO_2$ can be deposited on substrate 401 by electron beam evaporation.

Alternatively, or in addition, the post layer 411 can be formed using a growth process such as oxidation or epitaxy (e.g., vapor phase epitaxy, liquid phase epitaxy, molecular beam epitaxy). As an example, $SiO_2$ can be grown on a silicon substrate using vapor phase epitaxy. In some embodiments, the substrate 401 itself is used as the post layer 411. The thickness of post layer 411 can be selected based on the desired thickness of the post array.

Referring to FIG. 4C, an etch mask layer 421 then is deposited on surface 412 of post layer 411. The material forming the etch mask layer can include any material that can be patterned to form features that protect the underlying substrate 401 during subsequent processing steps. This includes, for example, resists such as those sensitive to light (e.g., positive or negative photoresists), charged particles (e.g., electron-beam resists, such as polymethylmethacrylate (PMMA)) or pressure (e.g., nanoimprint resists, such as PMMA or polystyrene (PS)). The material forming the etch mask layer 421 can be deposited using one of a variety of techniques, including, but not limited to, spin-coating or ink-jet printing. In certain embodiments, the etch mask layer 421 also is a material that can be re-shaped using a reflow process, as described below. In some embodiments, the thickness of the etch mask layer 421 can be 50 nm or more (e.g., about 100 nm or more, about 200 nm or more, about 400 nm or more, about 800 nm or more, about 1 µm or more, about 1.2 µm or more, about 1.4 µm or more, about 1.6 µm or more, about 1.8 µm or more, about 2 µm or more, about 5 µm or more, about 10 µm or more, about 20 µm or more).

In certain embodiments, the etch mask layer 421 then can be processed to form mask features 422, as shown in FIG. 4D. For example, etch mask layer 421 can be patterned using electron beam lithography or photolithograpy (e.g., using a photomask or using holographic techniques). In some embodiments, mask features 422 can be formed using nano-imprint lithography. In nano-imprint lithography, a pattern is impressed into the etch mask layer 421 using a mold. The patterned etch mask layer 421 includes thin portions and thick portions (not shown). The thin portions may be removed by etching (e.g., by oxygen reactive ion etching (RIE)) to expose a surface of post layer 411. The thick portions may also be etched, but are not always completely removed.

In some cases, processing the etch mask layer 421 includes a pre-shaping step to influence the final shape of the mask feature 422. For example, referring to FIG. 4E, a bright-field mask 430 can be used during the exposure step of photolithography. The bright-field mask diffracts the incident light L such that a diffraction pattern D forms to which the etch mask layer 421 is exposed. Depending on whether a positive or negative resist is used for the etch mask layer 421, the light intensity pattern of the diffracted light will be directly transferred or inversely transferred to the etch mask layer 421 during a resist development step. In the example of FIG. 4E, the diffraction pattern from the bright-field mask 430 gives rise to a depression 423 in the center of the etch mask feature 422. FIG. 8A shows an SEM of an exemplary resist structure that includes a depression.

In certain embodiments, a grey scale mask can be used to provide variable transmission of exposure radiation across its area. Use of a gray scale mask can be used to reduce the effect of the center point exposure discussed above. Such a reduction is termed an optical proximity correction.

Figure 4F:
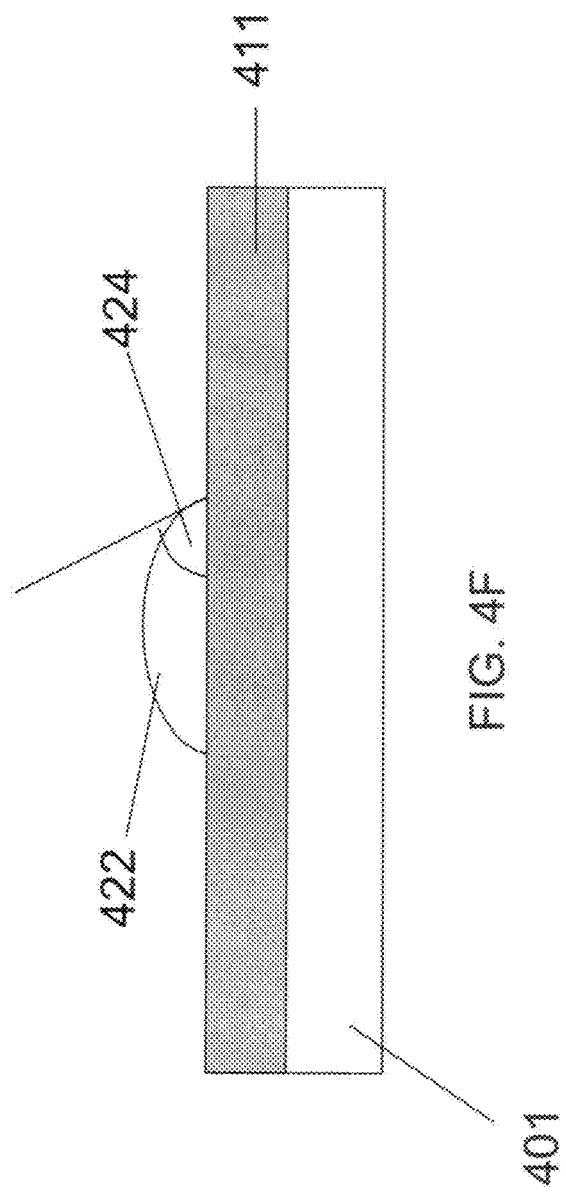

Referring to FIG. 4F, the shape of the remaining mask features 422 then can be re-shaped using a reflow process. To this end, the etch mask features 422 are heated to temperatures above the resist glass transition temperature $T_g$. In some embodiments, depending on the resist used, $T_g$ can be about 120° C. or more (e.g., about 130° C. or more, about 140° C. or more, about 150° C. or more, about 160° C. or more, about 170° C. or more, about 180° C. or more, about 190° C. or more, about 200° C. or more, about 220° C. or more, about 240° C. or more, about 260° C. or more, about 280° C. or more). Heating can be accomplished using general heating methods (e.g., convection ovens or hot-plates) or local heating methods (e.g., laser or e-beam heating of the resist or substrate). In some embodiments, the resist can be heat by placing the substrate on a hot plate having a temperature of about 130° C. to 135° C. for about 90 seconds.

It is believed that above $T_g$, mass transport mechanisms can take place. For example, due to surface tension, the shape of the etch mask resist changes to minimize surface energy. By selecting process variables (e.g., temperature and heating time), it is possible, in some implementations, to re-shape the etch mask features 422 to substantially resemble a desired post shape. For example, the reflow process may be used to form a spherical lens, an aspherical lens, a conical shaped post, a trapezoidal shaped post, a post with varying surface curvature, a ridge. Other etch mask feature shapes may be formed as well. The reshaped mask feature profile then can be transferred into the post layer 411. FIG. 8B shows an SEM of an exemplary mask feature that has been re-shaped using such a reflow process.

Without wishing to be bound by theory, it is believed that multiple factors can influence the shape of the etch mask feature 422 during the reflow process. In some embodiments, the shape of the etch mask feature 422 can be influenced by the ratio between the surface tension coefficients of the resist-air and resist-post layer interfaces. The surface tension of the resist-air interface varies for different resist materials and ambient processing conditions, such as gas composition, processing temperature and pressure. For example, reflow of the resist may occur in an inert gas atmosphere (e.g., helium or argon), a nitrogen atmosphere, a hydrogen atmosphere, an oxygen atmosphere, among others. In some embodiments, the processing temperature is about 100° C. or more (e.g., about 120° C. or more, about 130° C. or more, about 140° C. or more, about 150° C. or more, about 160° C. or more, about 170° C. or more, about 180° C. or more, about 190° C. or more, about 200° C. or more, about 220° C. or more, about 240° C. or more, about 260° C. or more, about 280° C. or more). In some embodiments, the pressure is about atmospheric pressure or less (e.g., about 300 torr or less, about 100 torr or less, about 10 torr or less, about 1 torr or less, about 0.1 torr or less, about 0.01 torr or less, 0.001 torr or less).

The surface tension of the resist-post layer interface can also vary for different post layer material. To increase the range of surface energy available between the resist and post layer, the surface of the post layer 411 can be coated with a functional layer prior to depositing the etch mask layer 421. For example, the surface of the etch mask layer 421 can be coated with a monolayer (e.g., a hydrophobic monolayer or a hydrophilic monolayer) that alters the surface energy of the etch mask layer 421. The monolayer can be formed on the surface of the etch mask layer 421 using techniques such as Langmuir-Blodgett or self-assembly. In some cases, the surface tension of the resist-post layer interface varies based on the roughness of the post-layer surface.

The shape of the etch mask feature 422 during the reflow process also can be influenced by the viscosity of the material used for the etch mask feature. Higher viscosity values can slow the movement of the etch mask material when it is above the glass transition temperature. Accordingly, the shape of the etch mask material may be easier to control when using materials with relatively higher viscosities. However, higher viscosities may also increase processing time. In some embodiments, the viscosity can be about 3000 cSt or less (e.g., about 1000 cSt or less, about 500 cSt or less, about 250 cSt or less, about 100 cSt or less, about 50 cSt or less, about 10 cSt or less, 1 cSt or less).

In some embodiments, the thickness of the etch mask material can influence the shape of the etch mask feature during reflow. For example, thicker material is more susceptible to the effect of gravitational forces. In some embodiments, gravitational effects will flatten the surface of the etch mask material during reflow and may decrease the etch mask feature height. For example, in embodiments where the etch mask material features have a relatively high aspect ratio (i.e., the ratio of their height to width is relatively large), gravitational forces can affect their shape.

By controlling the foregoing parameters, it is possible to modify the contact angle 424 of the etch mask feature 422. For example, increasing the processing temperature may increase the speed at which the etch mask material spreads out during reflow, such that the contact angle 424 is reduced. Similarly, exposing the etch mask features to temperatures above $T_g$ for longer periods of time allows the material to spread out more, thus further reducing the contact angle 424.

For etch mask features 422 that have been pre-shaped to include depressions or dips during photolithography, the reflow process can be used to further modify the shape of the depressions. For example, during reflow, the depth of the depressed area may be reduced as the etch mask material 421 seeks to minimize its surface energy and form a spherical surface. The reflow process may also serve to smooth out discontinuities and the surface roughness of the etch mask features 422. To fix the shape of the etch mask feature 422 after reflow, the temperature then is reduced below $T_g$.

Referring to FIG. 4G, the post layer is subsequently etched to transfer the shape of the etch mask feature 422 into the post layer 411. In some embodiments, the post layer 411 and etch mask feature 422 are exposed to a dry-etch. Examples of dry-etching include, but are not limited to, such plasma etching techniques as ion milling, RIE and deep RIE. The source gas used in plasma etching can include, for example, chlorine, fluorine, carbon tetrachloride, trifluoromethane, oxygen or argon. Typically, plasma etching techniques are unidirectional, in which the incident ions travel in a path perpendicular to the surface of a device.

In general, the etch selectivity of the etch mask feature 422 relative to the post layer 411 is selected to ensure that the profile of the etch mask feature 422 is reliably transferred to the post layer 411. For a one-to-one replication of the etch mask feature 422, equal etch rates for the etch mask layer 421 and the post layer 411 should be used. In addition, the etching process should have high anisotropy to reduce lateral etching. In the RIE etch process, the etch rates can be controlled through the composition of the reactive etching gas, the process temperature and pressure. In plasma enhanced dry-etching techniques such as ion-beam milling or chemically assisted ion-beam etching, the etch rate also can be controlled by changing the ion acceleration energy. The etch mask feature 422 can be completely or partially removed during the dry-etching of the post layer 411. In some cases, a portion of the etch mask feature 422 is not removed. In those cases, the remaining portion of the etch mask feature 422 can be removed using techniques that do not etch or consume any part of the post layer 411. For example, if the etch mask feature 422 is a photoresist, it may be removed using solvents such as acetone and isopropyl alcohol.

Depending on the specific application for which the post array is to be used, additional processing can take place once the post arrays have been formed. For example, additional layers can be formed on the post array surface.

Referring to FIG. 5, in certain embodiments, material is deposited onto posts 510 of post array 500 to form a further layer 520. In general, later 520 can be deposited in a variety of ways, including sputtering, electron beam evaporation, CVD (e.g., high density CVD or plasma-enhanced CVD) or atomic layer deposition (ALD). Layer 520 can be formed from a dielectric material (e.g., a metal oxide). In certain embodiments, layer 520 can be formed from a metal (e.g., aluminum, copper, silver, gold).

In certain embodiments, layer 520 can be a substantially conformal layer, and surface 521 of layer 520 can retain the shape of posts 510.

As an example, post array 510 can be used to form a lens array using, for example, ALD to deposit layers of one or more different materials onto the posts. Processes of forming a lens on a post are disclosed in U.S. application Ser. No. 11/598,494, entitled "LENS ARRAYS AND METHODS OF MAKING THE SAME," filed on Nov. 13, 2006, the entirety of which is incorporated herein by reference.

The final shape of a lens formed on a post is related to the shape of the post itself. Accordingly, lens shape can be controlled by controlling the shape of the posts as discussed above. For example, in some embodiments, a greater post contact angle reduces a radius of curvature of a subsequently-formed lens at its base. In contrast, a smaller post contact angle can increase a radius of curvature of a lens that is subsequently formed on the post at its base. In other words, careful control of the post shape can be used to provide lenses having a specific shape (e.g., an certain aspheric shape) or can provide greater fidelity of the shape of a lens across its entire surface as compared to lenses formed using conventional methods.

Figure 6:
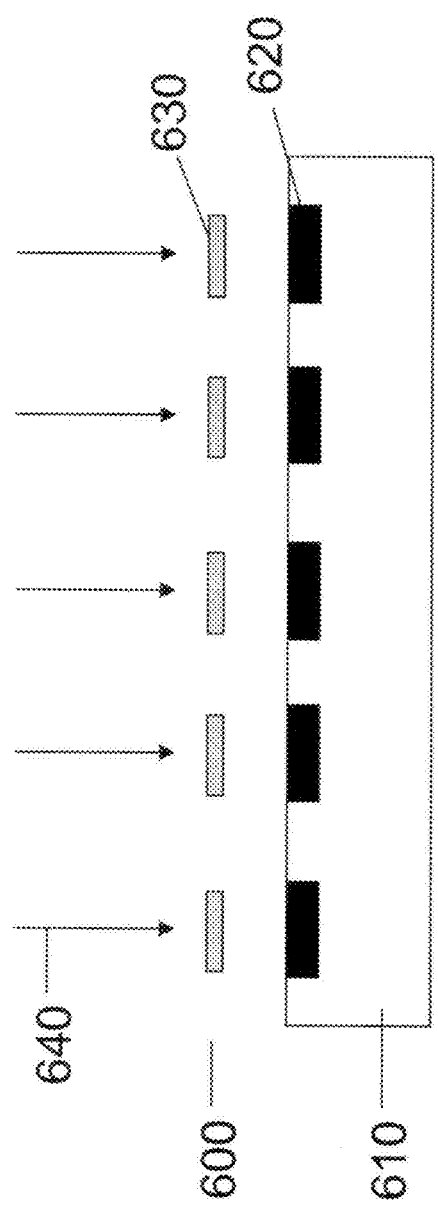
FIG. 6 shows an example of a lens array in a detector array.

Referring to FIG. 6, a lens array 600 can be used as part of a detector array 610 having light sensitive detector elements 620, positioned at or near the focal plane of a corresponding lens 630 in the array 600. Each lens 640 focuses incident light 640 onto a corresponding light sensitive detector element 620 located beneath the lens 630.

Detector arrays can be used in a variety of applications. In some embodiments, detector arrays are used in digital cameras, such as digital cameras for cellular telephones. Detector arrays can also be used in measurement tools, such as spectrophotometers, for example. In some embodiments, detector arrays are used in telecommunication systems. For example, detector arrays can be used in detection modules for fiber optic communication systems.

Figure 7:
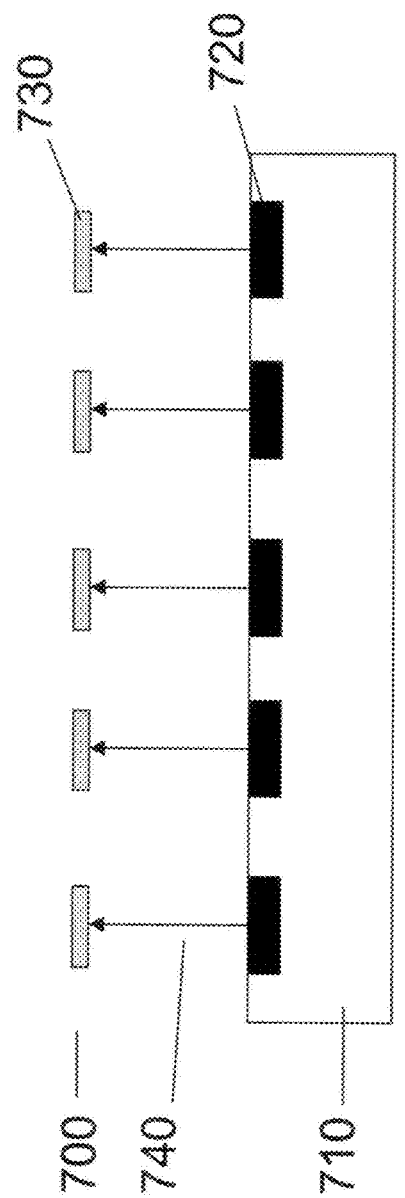
FIG. 7 shows an example of a lens array in a light emitting device.

Referring to FIG. 7, in some embodiments, a lens array 700 is used in an emissive device, such as in a flat panel display 710. In addition to lens array 700, flat panel display 710 includes an array of emissive pixels 720. Each emissive pixel 720 includes an emissive element which can emit light at a desired wavelength during operation of the display 710.

Each lens 730 of lens array 700 corresponds to a respective pixel 740. During operation, light 740 emitted from the corresponding pixel is collimated by the corresponding lens 730 of lens array 700, exiting display 710 propagating parallel to the z-axis. In this way, lens array 700 provides greater directionality to light emitted by display 710 compared to similar displays that don't include lens arrays.

In both detector array 610 and flat panel display 710, respective lens arrays 600 and 700 can be integrated onto the detector/pixel array during fabrication of the device.

In some applications, the posts 510 can be used as part of a microfluidic device. For example, in some embodiments, the ridge-shaped posts may serve as the sidewalls of microfluidic channels, through which fluids pass. In some implementations, posts in which depressions have been formed may be used as microfluidic chambers for observing and/or initiating reactions in tissue, cells, bacteria, and genes.

Other embodiments are in the following claims.

What is claimed is:

1. A method of manufacturing an optically transmissive material, comprising:
    forming layer of a mask material on a surface of a first layer;
    patterning the layer of the mask material to obtain a mask feature, the mask feature having a surface comprising a depression;
    inducing mass transport of the mask material of the mask feature to obtain a modified mask feature;
    transferring a profile of the modified mask feature into the first layer to form a post array, in which individual posts have: (a) a top portion having an indentation resulting from the depression; and (b) angled or curved sides resulting from induction of the mass transport; and
    forming a layer of a second material on a surface of at least an individual one of the posts to form a lens.

2. The method according to claim 1, wherein inducing mass transport of the mask feature comprises inducing reflow of the mask feature.

3. The method according to claim 2, wherein inducing reflow of the mask feature comprises heating the mask feature above a glass transition temperature of the mask material.

4. The method according to claim 3, wherein inducing reflow of the mask feature reduces a contact angle of the mask feature to between 60 and 80 degrees.

5. The method according to claim 4, further comprising cooling the modified mask feature to inhibit reflow prior to transferring the profile of the modified mask feature.

6. The method according to claim 1, wherein transferring the profile into the first layer comprises etching the first layer.

7. The method according to claim 6, wherein transferring the profile into the first layer comprises anisotropically etching the first layer.

8. The method according to claim 7, wherein the anisotropic etching comprises reactive ion etching.

9. The method according to claim 1, wherein the layer of the second material is formed using atomic layer deposition.

10. The method according to claim 9, wherein the lens comprises multiple layers of different dielectric materials.

11. The method of claim 1, wherein the first layer is composed of an amorphous material.

12. The method of claim 11, wherein the amorphous material is an inorganic, amorphous material.

13. The method of claim 11, wherein the amorphous material is a glass.

14. The method according to claim 1, further comprising applying a hydrophobic monolayer to the surface of the first layer prior to depositing the mask material.

15. The method according to claim 1, further comprising applying a hydrophilic monolayer to the surface of the first layer prior to depositing the mask material.

16. The method according to claim 1, wherein patterning the mask material comprises applying photolithography to the mask material.

17. The method according to claim 16, wherein applying photolithography comprises using a brightfield mask between a light source and the mask material.

18. The method according to claim 1, wherein patterning the mask material further comprises pre-shaping the mask feature.

19. The method according to claim 18, wherein pre-shaping the mask feature comprises plasma etching the mask feature.

20. A method of manufacturing an optically transmissive material, comprising:
    forming a layer of a mask material on a surface of a first layer;
    patterning the layer of the mask material to obtain a mask feature;
    inducing mass transport of the mask material of the mask feature to obtain a modified mask feature;
    transferring a profile of the modified mask feature into the first layer to form a post array, and
    forming a layer of a second material on a surface of at least an individual one of the posts to form a lens;
    wherein each of the posts has (a) a base side-wall angle in a range from about 60 degrees to about 80 degrees, and (b) a top portion having a depression.

* * * * *